US006403282B1

(12) United States Patent
Mayers et al.

(10) Patent No.: US 6,403,282 B1
(45) **Date of Patent: *Jun. 11, 2002**

(54) HEAT SENSITIVE PRINTING PLATE PRECURSORS

(75) Inventors: Felton Rudolph Mayers; Philip John Watkiss, both of Leeds (GB); Frederick Claus Zumsteg, Jr., Wilmington, DE (US)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/424,906

(22) PCT Filed: Jun. 2, 1998

(86) PCT No.: PCT/EP98/03474

§ 371 (c)(1), (2), (4) Date: Feb. 4, 2000

(87) PCT Pub. No.: WO98/55307

PCT Pub. Date: Dec. 10, 1998

(30) Foreign Application Priority Data

Jun. 3, 1997 (GB) .......................................... 9711382

(51) Int. Cl.[7] .......................... G03F 7/07; G03F 7/11; G03F 7/004; G03F 7/36; G03C 1/705

(52) U.S. Cl. .............................. 430/273.1; 430/276.1; 430/278.1; 430/302; 430/204; 430/616; 430/964

(58) Field of Search ............................... 430/201, 204, 430/273.1, 278.1, 275.1, 276.1, 302, 330, 964, 616

(56) References Cited

U.S. PATENT DOCUMENTS

| | | | | | |
|---|---|---|---|---|---|
| 4,018,605 | A | * | 4/1977 | Olsen | 430/204 |
| 4,340,509 | A | | 7/1982 | Canale et al. | |
| 4,504,406 | A | | 3/1985 | Dhillon | |
| 4,567,131 | A | * | 1/1986 | Watkiss | 430/204 |
| 4,576,743 | A | | 3/1986 | Kita et al. | |
| 5,401,611 | A | * | 3/1995 | Edwards et al. | 430/616 |
| 5,501,944 | A | * | 3/1996 | Hill et al. | 430/201 |
| 5,518,866 | A | | 5/1996 | Coppens et al. | |
| 5,807,658 | A | * | 9/1998 | Ellis et al. | 430/201 |
| 6,277,540 | B1 | * | 8/2001 | Watkiss | 430/616 |

FOREIGN PATENT DOCUMENTS

| | | | | |
|---|---|---|---|---|
| DE | 19748711 | | * | 5/1998 |
| EP | 131462 | | * | 1/1985 |
| EP | 0 131 462 | B1 | | 9/1991 |
| EP | 0 519 123 | A1 | | 12/1992 |
| EP | 609941 | | * | 8/1994 |
| EP | 0 651 063 | A1 | | 5/1995 |
| EP | 0 754 565 | A1 | | 1/1997 |
| FR | 2308956 | | * | 4/1976 |
| GB | 1 292 599 | | | 10/1972 |
| GB | 2 008 495 | A | | 6/1979 |
| GB | 2 283 335 | A | | 5/1995 |
| GB | 2 293 139 | A | | 3/1996 |
| JP | 52037104 | | * | 3/1977 |
| JP | 60072792 | | * | 4/1985 |

* cited by examiner

*Primary Examiner*—Richard L. Schilling
(74) *Attorney, Agent, or Firm*—Breiner & Breiner, L.L.C.

(57) ABSTRACT

A lithographic printing plate precursor comprises a grained and anodised aluminium substrate which has been treated with a solution of water-soluble salt of a Group IVa metal fluoride and over which is provided a metallic layer, preferably a silver layer. Imagewise exposure of the precursor by means of a high intensity laser beam allows for the direct provision of press ready plates showing high image quality and clean background, good press properties and high durability on press, without the requirement for the use of intermediate film and developer chemistry. The plate precursors show enhanced sensitivity on exposure, whereupon removal of the metallic layer occurs in the exposed areas.

9 Claims, No Drawings

HEAT SENSITIVE PRINTING PLATE PRECURSORS

This invention relates to the formation of images directly from electronically composed digital sources and is particularly concerned with the formation of images on lithographic printing plate precursors. More particularly, the invention relates to lithographic printing plate precursors which incorporate an imaging layer comprising metallic silver, and a method of preparing lithographic printing plates which does not require the use of chemical treatments.

Lithographic printing is a process of printing from surfaces which have been prepared in such a way that certain areas are capable of accepting ink (oleophilic areas), whereas other areas will not accept ink (oleophobic areas). The oleophilic areas form the printing areas while the oleophobic areas form the background areas.

Plates for use in lithographic printing processes may be prepared using a photographic material that is made imagewise receptive or repellent to ink upon photo-exposure of the photographic material and subsequent chemical treatment. However, this method of preparation, which is based on photographic processing techniques, involves several steps, and therefore requires a considerable amount of time, effort and expense.

Consequently it has, for many years, been a long term aim in the printing industry to form images directly from an electronically composed digital database, ie by a so-called "computer-to-plate" system. The advantages of such a system over the traditional methods of making printing plates are:

(i) the elimination of costly intermediate silver film and processing chemicals;

(ii) a saving of time; and (iii) the ability to automate the system with consequent reduction in labour costs.

The introduction of laser technology provided the first opportunity to form an image directly on a printing plate precursor by scanning a laser beam across the surface of the precursor and modulating the beam so as to effectively turn it on and off. In this way, radiation sensitive plates comprising a high sensitivity polymer coating have been exposed to laser beams produced by water cooled UV argon-ion lasers and electrophotographic plates having sensitivities stretching into the visible spectral region have been successfully exposed using low powered air-cooled argon-ion, helium-neon and semiconductor laser devices.

Imaging systems are also available which involve a sandwich structure which, on exposure to a heat generating infra-red laser beam, undergoes selective (imagewise) delamination and subsequent transfer of materials. Such so-called peel-apart systems are generally used as replacements for silver halide films.

A digital imaging technique has been described in U.S. Pat. No. 4,911,075 whereby a so-called driographic plate which does not require dampening with an aqueous fountain solution to wet the non-image areas during printing is produced by means of a spark discharge. In this case, a plate precursor comprising an ink-repellent coating containing electrically conductive particles coated on a conductive substrate is used and the coating is ablatively removed from the substrate. Unfortunately, however, the ablative spark discharge provides images having relatively poor resolution.

It is known to improve this feature by the use of lasers to obtain high resolution ablation as described, for example, by P E Dyer in "Laser Ablation of Polymers" (Chapter 14 of "Photochemical Processing of Electronic Materials", Academic Press, 1992, p359–385). Until recently, imaging via this method generally involved the use of high power carbon dioxide or excimer lasers. Unfortunately, such lasers are not well-suited to printing applications because of their high power consumption and excessive cost, and the requirement for high pressure gas handling systems. Recent developments have, however, led to the availability of more suitable infra-red diode lasers, which are compact, highly efficient and very economical solid state devices.

High power versions of such lasers, which are capable of delivering up to 3000 $mJ/cm^2$, are now commercially available.

Coatings which may be imaged by means of ablation with infra-red radiation have previously been proposed. Thus, for example, a proofing film in which an image is formed by imagewise ablation of a coloured layer on to a receiver sheet is described in PCT Application No 90/12342. This system is, however, disadvantageous in requiring a physical transfer of material in the imaging step, and such methods tend to give rise to inferior image resolution.

Much superior resolution is obtained by means of the ablation technique described in European Patent No 649374, wherein a driographic printing plate precursor is imaged digitally by means of an infra-red diode laser or a YAG laser, and the image is formed directly through the elimination of unwanted material. The technique involves exposing a plate precursor, incorporating an infra-red radiation ablatable coating covered with a transparent cover sheet, by directing the beam from an infrared laser at sequential areas of the coating so that the coating ablates and loses its ink repellancy in those areas to form an image, removing the cover sheet and ablation products, and inking the image.

A heat mode recording material is disclosed in U.S. Pat. No. 4034183 which comprises an anodised aluminium support coated with a hydrophilic layer. On imagewise exposure using a laser, the exposed areas are rendered hydrophobic, and thereby accept ink.

Japanese patent application laid open to public inspection No 49-117102 (1974) discloses a method for producing printing plates wherein a metal is incorporated in the imaging layer of a printing plate precursor which is imaged by irradiation with a laser beam modulated by electric signals. Typically, the plate precursor comprises a metal base, such as aluminium, coated with a resin film, which is typically nitrocellulose, and on top of which has been provided a thin layer of copper. The resin and metal layers are removed in the laser-struck areas, thereby producing a printing plate. The disadvantage of this system, however, is that two types of laser beam irradiation are required in order to remove firstly the copper (eg by means of an argon-ion laser) and then the resin (eg with a carbon dioxide laser); hence, the necessary equipment is expensive.

Subsequently a method of printing plate production which obviated the requirement for a second laser exposure was disclosed in Japanese patent application laid open to public inspection No 52-37104 (1977). Thus, a printing plate precursor comprising a support, typically aluminium, an anodic aluminium oxide layer, and a layer of brass, silver, graphite or, preferably, copper is exposed to a laser beam of high energy density in order to render the exposed areas hydrophilic to yield a printing plate. The printing plate precursor is. however, of rather low sensitivity and requires the use of a high energy laser for exposure.

An alternative heat mode recording material for making a lithographic printing plate is disclosed in European Patent No 609941, which comprises a support having a hydrophilic surface, or provided with a hydrophilic layer, on Which is coated a metallic layer, on top of which is a hydrophobic layer having a thickness of less than 50 nm. A lithographic printing plate may be produced from the said material by imagewise exposing to actinic radiation, thereby rendering the exposed areas hydrophilic and repellent to greasy ink. Conversely, European Patent No 628409 discloses a heat mode recording material for making a lithographic printing plate which comprises a support and a metallic layer, on top of which is provided a hydrophilic layer having a thickness of less than 50 nm. A lithographic printing plate is produced by imagewise exposing the material to actinic radiation in order to render the exposed areas hydrophobic and receptive to greasy ink.

In each of the two foregoing heat mode recording materials, however, difficulties in printing will be encountered. On exposure of the materials to actinic radiation, the energy is converted to heat in the image areas by interaction with the metallic layer, thereby destroying the hydrophilicity or hydrophobicity—depending on the material employed—of the topmost layer in those areas. Consequently, the surface of the metallic layer becomes exposed, and the success of the printing operation is dependent upon differences in hydrophilicity and oleophilicity between the metallic surface and the hydrophilic or hydrophobic layer, as the case may be. Since the metallic layer functions as the hydrophobic surface in one case, and as the hydrophilic surface in the alternative case, it would be expected that such differences in hydrophilicity and oleophilicity would not be sufficiently clearly defined so as to provide a satisfactory printing surface. Furthermore, when a hydrophilic layer is present, and the metallic surface functions as the oleophilic areas of the plate, image areas will necessarily be printed from the metallic surface; such an arrangement is known to be unsatisfactory, and to result in difficulties in achieving acceptable printing quality.

It is an object of the present invention to provide a lithographic printing plate having excellent printing properties, and a method of making said plate which obviates the requirement for the use of processing developers after exposure.

It is a further object of the present invention to provide a method of preparing a lithographic printing plate which does not require the use of costly intermediate film and relies on direct-to-plate exposure techniques.

It is a still further object of the present invention to provide a method of producing a lithographic printing plate in which a high quality image results from the ablation of a metallic layer from a hydrophilic support, thus providing a high degree of differentiation between hydrophilic and oleophilic areas.

It is an additional object of the present invention to provide a lithographic printing plate precursor having improved sensitivity to heat mode laser beam imagewise exposure.

It is also an object of the present invention to provide a lithographic printing plate having improved clean-up properties in the hydrophilic background areas after imagewise exposure, such that ink adhesion does not occur in these non-image areas.

It has been observed that when a layer of silver or other metal is deposited on a grained and anodised aluminium substrate and subsequently exposed to high intensity electromagnetic radiation, the silver or other metal appears to melt and form into tiny droplets having a high contact angle with the aluminium oxide surface. Repulsion of these droplets from the substrate then occurs, leaving the hydrophilic anodic layer exposed. Thus, image formation is achieved by selective imagewise exposure to the incident radiation.

Furthermore, the present inventors have also observed that the repulsive tendency between the laser-activated silver or other metal and the anodic layer on the grained and anodised substrate may be enhanced by treating the anodic surface layers, prior to deposition of the silver or other metal, with a soluble salt of a Group 4 metal fluoride.

Thus, according to a first aspect of the present invention there is provided a lithographic printing plate precursor comprising:

(i) a grained and anodised aluminium substrate, having been treated with (ii) a solution of a water soluble salt of a Group 4 metal fluoride, over which is provided (iii) a metallic layer.

Optionally, a further layer or layers comprising, for example, a transparent cover sheet or layer of material for collecting ablated debris, may be provided on top of the metallic layer.

Suitable water soluble salts of Group 4 metal fluorides include salts of zirconium, hafnium and titanium, typically alkali metal or ammonium salts of hexafluorozirconates, hexafluorohafnates and hexafluorotitanates such as sodium hexafluorohafnate, ammonium hexafluorotitanate and, most particularly, potassium hexafluorozirconate.

Treatment of the substrate with a solution of a water soluble salt of a Group 4 metal fluoride is most conveniently achieved by dipping the grained and anodised substrate in an aqueous solution containing 0.01% –10%, typically 0.1% –1.0% of the salt at a temperature between 20° and 60° C., typically between 35° and 50° C. for between 15 seconds and 5 minutes, typically between 30 seconds and 2 minutes.

The substrate employed in the present invention is an aluminium substrate which has been electrochemically grained and anodised on at least one surface in order to enhance its lithographic properties. Optionally, the aluminium may be laminated to other materials, such as paper or various plastics materials, in order to enhance its flexibility, whilst retaining the good dimensional stability associated with aluminium.

The metallic layer, which is applied to the grained, anodised and dipped surface of the aluminium, may comprise any of several metals, specific examples of which include copper, bismuth and brass. Most preferably, however, the metallic layer comprises a silver layer. The thickness of the metallic layer is preferably from 20 nm to 200 nm, most preferably from 40 nm to 100 nm.

Various techniques are available for the application of the metallic layer to the grained, anodised and dipped aluminium substrate, including vapour or vacuum deposition or sputtering. In the case where the metal layer comprises a silver layer, however, the most preferred method for applying the layer involves the treatment of a silver halide photographic material according to the silver salt diffusion transfer process.

In the diffusion transfer process, a silver halide emulsion layer is transformed by treatment with a so-called silver halide solvent, into soluble silver complex compounds which are then allowed to diffuse into an image receiving layer and are reduced therein by means of a developing agent, generally in the presence of physical development nuclei, to form a metallic silver layer.

Two such systems are available: a two sheet system in which a silver halide emulsion layer is provided on one element, and a physical development nuclei layer is provided on a second element, the two elements are placed in contact in the presence of developing agent(s) and silver halide solvent(s) in the presence of an alkaline processing liquid, and subsequently peeled apart to provide a metallic silver layer on the second element; and a single sheet system wherein the element is provided with a physical development nuclei layer, a silver halide emulsion layer is provided on top thereof, the element is treated with developing agent(s) and silver halide solvent(s) in the presence of an alkaline processing liquid, and the element is washed to remove spent emulsion layer and leave a metallic silver layer which is formed in the layer containing physical development nuclei.

Alternatively, the diffusion transfer process may be used to apply a metallic silver layer by overall exposing a positive working silver halide emulsion layer to form a latent negative image which is then developed in contact with a physical development nuclei layer to form a metallic silver layer. Again, the process may be carried out using either a single sheet or a double sheet system.

The principles of the silver complex diffusion transfer process are fully described in the publication "Photographic Silver Halide Diffusion Processes" by Andre Rott and Edith Weyde, The Focal Press, London and New York, 1972, and further detail may be gleaned by reference thereto.

According to a second aspect of the present invention, there is provided a method of preparing a lithographic printing plate, said method comprising:

a) providing a lithographic printing plate precursor as hereinbefore described; and b) imagewise exposing said precursor by means of a high intensity laser beam.

In the case when a transparent cover sheet or layer of material is present on top of the metallic layer, said sheet or layer of material is removed following imagewise exposure of the printing plate precursor.

In order to prepare a lithographic printing plate, the precursor is imaged by a beam of radiation, preferably from a laser operating in the infra-red region of the spectrum. Examples of suitable infra-red lasers include semiconductor lasers and YAG lasers, for example the Gerber Crescent 42T Platesetter with a 10 W YAG laser outputting 1064 nm. Exposure to the beam of radiation causes ablation of the metallic layer to occur in the radiation-struck areas.

The enhanced repulsive tendency which is observed between the laser activated silver or other metal and the anodic layer on the grained and anodised substrate results in a lower energy requirement for ablation of the silver or other metal, and cleaner removal of said metal on imagewise laser exposure.

Consequently, it is possible to achieve improved productivity with the imaging device, and greater accuracy of densitometric measurements prior to use of the plate on the press; the latter data facilitate the prediction of the quality of image reproduction in the final printed image.

Prior to, or following exposure, the plate may be prepared for printing operations by treatment with a composition comprising a proteolytic enzyme, a silver oleophilising agent and a desensitising compound. In this way, it is possible to ensure good ink acceptance in image areas and a high degree of hydrophilicity in background areas, thus facilitating a good start-up on press.

Suitable enzymes for use in the above composition may include, for example, trypsin, pepsin, ficin, papain or the bacterial proteases or proteinases. Oleophilising compounds may be chosen from those disclosed on pages 105 to 106 of "Photographic Silver Halide Diffusion Processes" by Andre Rott and Edith Weyde, but mercapto compounds and cationic surfactants such as quaternary ammonium compounds are of particular value. Carbohydrates such as gum arabic, dextrin and inorganic polyphosphates such as sodium hexametaphosphate provide useful desensitising compounds in these compositions.

Typically, the compositions comprise aqueous solutions containing from 0.1% to 10.0% by weight of enzyme, from 0.05% to 5.0% by weight of oleophilising compound and from 1.0% to 10.0% by weight of desensitising compound.

The printing plate precursor and the method of the present invention provide press ready plates showing high image quality and clean background, good press properties and high durability on press without the requirement for the use of costly intermediate film and developer chemistry and the attendant inconvenience resulting from the use of these materials. Furthermore, printing plate precursors of the present invention provide enhanced sensitivity when compared with samples which do not include a layer of a water soluble salt of a Group 4 metal Fluoride.

The following example is illustrative of the invention, without placing any limitation on the scope thereof:

EXAMPLE

A sheet of aluminium metal was degreased in a 5% w/w aqueous solution of sodium hydroxide before being electrochemically grained with an alternating electric current in a mixture of acetic and hydrochloric acids according to the method disclosed in British Patent No 1598701 then cleaned with a 10% aqueous solution of phosphoric acid and finally anodised with a direct electric current in sulphuric acid.

After rinsing with water, the sheet was dipped into a 0.5% w/w aqueous solution of potassium hexafluorozirconate at 42 ° C. for 45 seconds, then rinsed with water and dried.

A Carey Lea colloidal dispersion of silver was applied to the grained, anodised and treated surface of the aluminium substrate to give a coating weight of 1 $mg/m^2$ of silver, and this was then further coated with a gelatino-silver chlorobromide dispersion to give a coating weight of 4 $g/m^2$ and a silver coating weight of 1.6 $g/m^2$.

The resulting assembly was dipped into a diffusion transfer developer solution at 20 ° C. for 20 seconds and then rinsed with warm water to give a physically developed silver layer having a deposition weight of 0.6 $g/m^2$.

This printing plate precursor was loaded onto a Gerber Crescent 42T internal drum Laser Platesetter fitted with an extraction system comprising a curved nozzle about 1cm from the plate surface, an air suction pump and a 0.3 $\mu$m HEPA filter for removal of ablation debris and imagewise exposed to a 10 W YAG laser outputting at a wavelength of 1064 nm and peak power density of 3.1 MW/cm2. The resulting printing plate produced 80,000 good quality copies on a Drent Web Offset printing press, showing a clean background in non-image areas.

As a control, a similar printing plate precursor was produced, whilst omitting the treatment in aqueous potassium hexafluorozirconate. This plate required a peak power density of 6.5 $MW/cm^2$ on exposure to produce an image. The plate produced 80,000 copies on a Drent Web Offset printing press, but the background areas showed an uneven yellow stain believed to be due to retained residual silver. It was not possible to accurately read the plate with a densitometer.

What is claimed is:

1. A method of preparing a lithographic printing plate precursor suitable for heat-mode exposure, said method comprising, prior to said heat mode exposure, steps of:

(a) providing a grained and anodized aluminum substrate, (b) treating the substrate with a solution of a water-soluble salt of a Group 4 metal fluoride, (c) forming a continuous metallic layer on the substrate, (d) treating the metallic layer with a solution comprising a proteolytic enzyme, an oleophilizing agent and a desensitizing compound.

2. A method as defined in claim 1 wherein said metallic layer comprises a silver layer.

3. A method as defined in claim 2 wherein said silver layer is formed by means of a silver salt diffusion transfer process.

4. A method as defined in claim 1 wherein said metallic layer has a thickness of from 20 nm to 200 nm.

5. A method as defined in claim 1 wherein said water-soluble salt of a Group 4 metal fluoride comprises a water-soluble salt of zirconium, hafnium or titanium.

6. A method as defined in claim 5 wherein said salt comprises an alkali metal or ammonium salt of a hexafluorozirconate, hexafluorohafnate or hexfluorotitanate.

7. A method as defined in claim 6 wherein said salt comprises sodium hexafluorohafnate, ammonium hexfluorotitanate or potassium hexafluorozirconate.

8. A method as defined in claim 1 further comprising a step (e), carried out after step (d), of providing a transparent cover sheet or layer on top of said metallic layer.

9. A method of preparing a lithographic printing plate comprising steps of (i) making a lithographic printing plate precursor according to the method of claim 1, 2, 3, 4, 5, 6, 7 or 8 , and (ii) imagewise exposing the precursor by means of a laser beam.

* * * * *